(12) United States Patent
Bonderson et al.

(10) Patent No.: US 8,748,196 B2
(45) Date of Patent: Jun. 10, 2014

(54) COHERENT QUANTUM INFORMATION TRANSFER BETWEEN TOPOLOGICAL AND CONVENTIONAL QUBITS

(71) Applicant: Microsoft Corporation, Redmond, WA (US)

(72) Inventors: Parsa Bonderson, Santa Barbara, CA (US); Roman M. Lutchyn, Santa Barbara, CA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 14/064,929

(22) Filed: Oct. 28, 2013

(65) Prior Publication Data

US 2014/0050475 A1 Feb. 20, 2014

Related U.S. Application Data

(62) Division of application No. 13/292,217, filed on Nov. 9, 2011.

(60) Provisional application No. 61/412,225, filed on Nov. 10, 2010.

(51) Int. Cl.
| | |
|---|---|
| *H01L 21/00* | (2006.01) |
| *H01L 29/06* | (2006.01) |
| *H01L 29/08* | (2006.01) |
| *H01L 31/0256* | (2006.01) |
| *H01L 39/22* | (2006.01) |
| *H03K 19/195* | (2006.01) |

(52) U.S. Cl.
USPC ............... 438/2; 257/31; 257/E39.012; 326/3

(58) Field of Classification Search
USPC ............... 257/31–33, 36, E39.003, E39.012, 257/E39.014, E49.017; 438/2, FOR. 421; 326/1–7
See application file for complete search history.

(56) References Cited

U.S. PATENT DOCUMENTS

| | | | |
|---|---|---|---|
| 7,006,267 B2 | 2/2006 | Franson et al. | |
| 7,307,275 B2 | 12/2007 | Lidar et al. | |
| 2001/0023943 A1 | 9/2001 | Zagoskin | |
| 2004/0000666 A1 | 1/2004 | Lidar et al. | |
| 2004/0119061 A1* | 6/2004 | Wu et al. ........................ | 257/9 |

(Continued)

OTHER PUBLICATIONS

NPL1: Quantum State Transfer via Parity Measurement, Jie Song • Yan Xia • He-Shan Song, Int J Theor Phys (2008) 47: 1294-1299.*

(Continued)

*Primary Examiner* — Daniel Luke
*Assistant Examiner* — Khaja Ahmad
(74) *Attorney, Agent, or Firm* — Steve Wight; Ramesh Kuchibhatla; Micky Minhas

(57) ABSTRACT

Computing bus devices that enable quantum information to be coherently transferred between topological and conventional qubits are disclosed. A concrete realization of such a topological quantum bus acting between a topological qubit in a Majorana wire network and a conventional semiconductor double quantum dot qubit is described. The disclosed device measures the joint (fermion) parity of the two different qubits by using the Aharonov-Casher effect in conjunction with an ancillary superconducting flux qubit that facilitates the measurement. Such a parity measurement, together with the ability to apply Hadamard gates to the two qubits, allows for the production of states in which the topological and conventional qubits are maximally entangled, and for teleporting quantum states between the topological and conventional quantum systems.

20 Claims, 4 Drawing Sheets

(56) References Cited

U.S. PATENT DOCUMENTS

| | | | |
|---|---|---|---|
| 2005/0133780 A1* | 6/2005 | Azuma | 257/13 |
| 2009/0079421 A1 | 3/2009 | Freedman et al. | |
| 2009/0097652 A1 | 4/2009 | Freedman et al. | |
| 2009/0261319 A1 | 10/2009 | Maekawa et al. | |
| 2009/0296258 A1 | 12/2009 | Miyanishi et al. | |
| 2010/0264910 A1 | 10/2010 | Bonderson | |
| 2012/0112168 A1 | 5/2012 | Bonderson et al. | |
| 2012/0155870 A1* | 6/2012 | Harrison et al. | 398/45 |
| 2012/0187378 A1 | 7/2012 | Bonderson et al. | |

OTHER PUBLICATIONS

NPL2: Measuring the Parity of an N-Qubit State, B. Zeng, D. L. Zhou and L. You PRL 95, 110502 (2005) Physical Review Letters week ending, Sep. 9, 2005.*

Aharonov et al., "Topological Quantum Effects for Neutral Particles", Physical Review Letters, vol. 53, No. 4, Jul. 23, 1984, 319-321.

Akhmerov et al., "Electrically Detected Interferometry of Majorana Fermions in a Topological Insulator", Physical Review Letters, PRL 102, 216404, May 29, 2009, 1-4.

Alicea et al., "Non-Abelian statistics and topological quantum information processing in 1D wire networks", Nature Physics 7, Sep. 21, 2010, 1-23.

Bennett et al., "Teleporting an Unknown Quantum State via Dual Classical and Einstein-Podolsky-Rosen Channels", Physical Review Letters, vol. 70, No. 13, Mar. 29, 1993, 1895-1899.

Bonderson et al., "A Blueprint for a Topologically Fault-tolerant Quantum Computer", Mar. 15, 2010, arXiv:1003.2856, pp. 1-6.

Bonderson, "Implementing Arbitrary Phase Gates with Ising Anyons", Physical Review Letters, PRL 104, 180505, May 7, 2010, 1-4.

Bonderson, "Splitting the Topological Degeneracy of Non-Abelian Anyons", Physical Review Letters, PRL 103, 110403, Sep. 11, 2009, 1-4.

Bonderson, "Topological Quantum Buses: Coherent Quantum Information Transfer Between Topological and Conventional Quibits", U.S. Appl. No. 61/412,225, filed Nov. 10, 2010.

Bravyi et al., "Quantum Invariants of 3-Manifolds and Quantum Computation", Nov. 2000, 1-28.

Bravyi et al., "Universal quantum computation with ideal Clifford gates and noisy ancillas", Physical Review A 71, 022316, Feb. 22, 2005, 1-14.

Chirolli, "Full Control of Qubit Rotations in a Voltage-Biased Superconducting Flux Qubit", Phys. Rev. B 74, 174510, Apr. 3, 2007, 12 pgs.

Clarke et al., "Improved phase-gate reliability in systems with neutral Ising anyons", Rapid Communications, Physical Review B 82, 180519(R), Nov. 29, 2010, 1-4.

Devoret, "Superconducting Qubits: A Short Review", arXiv:cond-mat/0411174, Nov. 7, 2004, 41 pgs.

Elion et al., "Observation of the Aharonov-Casher Effect for Vortices in Josephson-Junction Arrays", Physical Review Letters, vol. 71, No. 14, Oct. 4, 1993, 1-4.

Freedman, "P/NP, and the quantum field computer", Proc. Natl. Acad. Sci. USA, Computer Sciences, vol. 95, Jan. 1998, 98-101.

Freedman et al., "Towards universal topological quantum computation in the v=5/2 fractional quantum Hall state", Physical Review B 73, 245307, Jun. 7, 2006, 1-21.

Friedman et al., "Aharonov-Casher-Effect Suppression of Macroscopic Tunneling of Magnetic Flux", Physical Review Letters, vol. 88, No. 5, Feb. 4, 2002, 1-4.

Fu et al., "Probing Neutral Majorana Fermion Edge Modes with Charge Transport", Physical Review Letters, PRL 102, 216403, May 29, 2009, 1-4.

Grosfeld et al., "Proposed Aharonov-Casher interference measurement of non-Abelian vortices in chiral p-wave superconductors", Physical Review B 83, 104513, Mar. 21, 2011, 1-7.

Hanson et al., "Spins in few-electron quantum dots", Reviews of Modern Physics, vol. 79, Oct.-Dec. 2007, 1217-1265.

Hassler et al., "Anyonic interferometry without anyons: how a flux qubit can read out a topological qubit", New Journal of Physics, vol. 12, Dec. 1, 2010, 13 pages.

Hayashi et al., "Coherent Manipulation of Electronic States in a Double Quantum Dot", Physical Review Letters, vol. 91, No. 22, Nov. 28, 2003, 1-4.

Jiang et al., "Interface between Topological and Superconducting Qubits", Physical Review Letters, PRL 106, 130504, Apr. 1, 2011, 1-4.

Kitaev, "Fault-tolerant quantum computation by anyons", Annals Phys. 303, Dec. 20, 2010, 1-27.

Kitaev, "Unpaired Majorana fermions in quantum wires", Microsoft Research, Oct. 27, 2010, 1-16.

Ladd et al., "Quantum computers", Nature, vol. 464, Mar. 4, 2010, 45-53.

Ladd, "Quantum Computing", Nature 464, 45-53, Jun. 15, 2009, 26 pgs.

Lutchyn, "Effect of Quantum Fluctuations on Even-Odd Energy Difference in a Cooper-Pair Box", Phys. Rev. B, 75, Mar. 16, 2007, 4 pgs.

Lutchyn et al., "Majorana Fermions and a Topological Phase Transition in Semiconductor-Superconductor Heterostructures", Physical Review Letters, PRL 105, 077001, Aug. 13, 2010, 1-4.

Lutchyn et al., "Search for Majorana Fermions in Multiband Semiconducting Nanowires", Physical Review Letters, PRL 106, 127001, Mar. 25, 2011, 1-4.

Mooji et al., "Josephson Persistent-Current Qubit", Science, vol. 285, Aug. 13, 1999, 1036-1039.

Nadj-Perge et al., "Spin-orbit qubit in a semiconductor nanowire", Nature, vol. 468, Dec. 23-30, 2010, 1084-1087.

Nayak et al., "Non-Abelian anyons and topological quantum computation", Reviews of Modern Physics, vol. 80, Jul.-Sep. 2008, 1083-1159.

Nilsson et al., "Theory of non-Abelian Fabry-Perot interferometry in topological insulators", Physical Review B 81, 205110, May 11, 2010, 1-11.

Oreg et al., "Helical Liquids and Majorana Bound States in Quantum Wires", Physical Review Letters, PRL 105, 177002, Oct. 22, 2010, 1-4.

Paila et al., "Current-phase relation and Josephson inductance in a superconducting Cooper-pair transistor", Physical Review B 80, 144520, Oct. 21, 2009, 1-5.

Sau et al., "Probing non-Abelian statistics with Majorana fermion interferometry in spinorbit-coupled semiconductors", Phys. Rev. B 84, 085109, Apr. 27, 2010, 1-5.

Sau et al., "Universal quantum computation in a semiconductor quantum wire network", Physical Review A 82, 052322, Nov. 19, 2010, 1-6.

Shinkai et al., "Correlated Coherent Oscillations in Coupled Semiconductor Charge Qubits", Physical Review Letters, PRL 103, 056802, Jul. 31, 2009, 1-4.

Tiwari et al., "Suppression of tunneling in a superconducting persistent-current qubit", Rapid Communications, Physical Review B 76, 220505(R), Dec. 12, 2007, 1-4.

Volovik, "Comment on Vortex Mass and Quantum Tunneling of Vortices", Jan. 9, 1997, Journal of Experimental and Theoretical Physics Letters vol. 65, Issue 2, pp. 1-10.

Wallraff et al., "Quantum dynamics of a single vortex", Nature, vol. 425, Sep. 11, 2003, 155-158.

Ju, et al., "The dynamics of a double-dot charge qubit embedded in a suspended phonon cavity", The European Physical Journal B, vol. 72, EDP Sciences, 2009, pp. 417-422.

Office action for U.S. Appl. No. 14/064,828, mailed on Jan. 8, 2014, Bonderson, et al., "Coherent Quantum Information Transfer Between Conventional Qubits", 19 pages.

Quan, et al., "Controlled quantum state transfer via parity measurement", Science in China Series G: Physics, Mechanics & Astronomy, vol. 52, No. 8, 2009, pp. 1203-1207.

\* cited by examiner

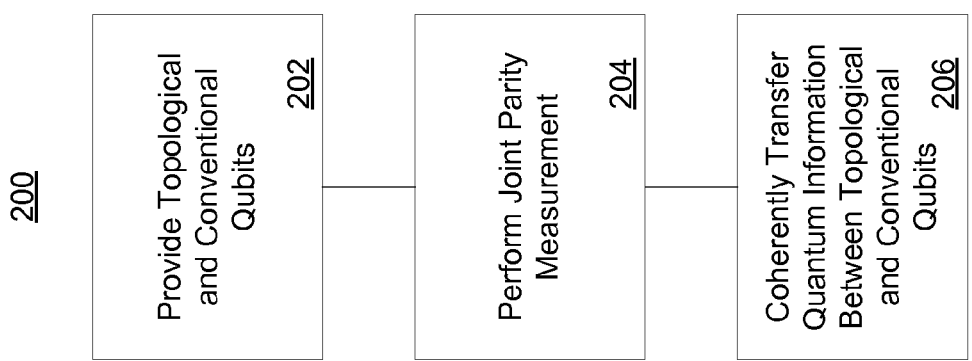

COHERENT QUANTUM INFORMATION TRANSFER BETWEEN TOPOLOGICAL AND CONVENTIONAL QUBITS

CROSS-REFERENCE TO RELATED APPLICATIONS

This patent application is a divisional application of co-pending, commonly owned U.S. patent application Ser. No. 13/292,217, filed Nov. 9, 2011, which claims the benefit of provisional U.S. patent application Ser. No. 61/412,225, filed Nov. 10, 2010, which applications are hereby incorporated herein by reference.

This application is related to U.S. patent application Ser. No. 13/292,220, filed on Nov. 9, 2011, entitled "Coherent Quantum Information Transfer Between Conventional Qubits," the disclosure of which is hereby incorporated herein by reference.

TECHNICAL FIELD

Generally, this application relates to quantum computational systems. More specifically, the application relates to devices that can entangle and coherently transfer quantum information between topological and conventional quantum media.

BACKGROUND

The topological approach to quantum information processing obtains exceptional fault-tolerance by encoding and manipulating information in non-local (i.e., topological) degrees of freedom of topologically ordered systems. Such non-local degrees of freedom typically do not couple to local operations. Consequently, the error rates for topological qubits and computational gates may be exponentially suppressed with distance between anyons and inverse temperature.

This suppression of error rates may provide an advantage over conventional quantum computing platforms. However, it also makes it challenging to coherently transfer quantum information into and out of topological systems. Not only is coupling the non-local degrees of freedom in the topological system to an external system required, but it must be done in a controlled and coherent manner. Consequently, it is desirable to create quantum entanglement between the topological and conventional states.

SUMMARY

Described herein is a device that can entangle and coherently transfer quantum information between topological and conventional quantum media. Such a device may be referred to herein as a "topological quantum bus." The device allows for harnessing the relative strengths of the different quantum media, and may be implemented in connection with quantum computation.

An example of how a topological quantum bus may be useful stems from the understanding that a computationally universal gate set cannot be produced for Ising anyons using topologically-protected braiding operations alone. Unless a truly topologically ordered Ising system is provided (which is not the case for superconductor-based systems, including Majorana wires), and can perform certain well-known topology changing operations, braiding operations need to be supplemented with topologically unprotected operations. Fortunately, these can be error-corrected for an error-rate threshold of approximately 0.14 by using the topologically-protected Ising braiding gates to perform "magic-state distillation."

Within a topological system, unprotected gates can be generated by, for example, bringing non-Abelian anyons close to each other, which generically splits the energy degeneracy of the topological state space and, hence, dynamically gives rise to relative phases, or by using interfering currents of anyons, which can have an equivalent effect. However, besting even such a high error threshold may still prove difficult using unprotected operations within a topological system, as a result of significant non-universal effects. A topological quantum bus allows for the desired topologically unprotected gates to be imported from conventional quantum systems, for which error rates below 0.14% of logical operations have already been achieved.

BRIEF DESCRIPTION OF THE FIGURES

FIG. 5 is a flowchart of a method for coherent quantum information transfer between topological and conventional semiconductor qubits using joint parity measurements.

DETAILED DESCRIPTION

Figure 1:
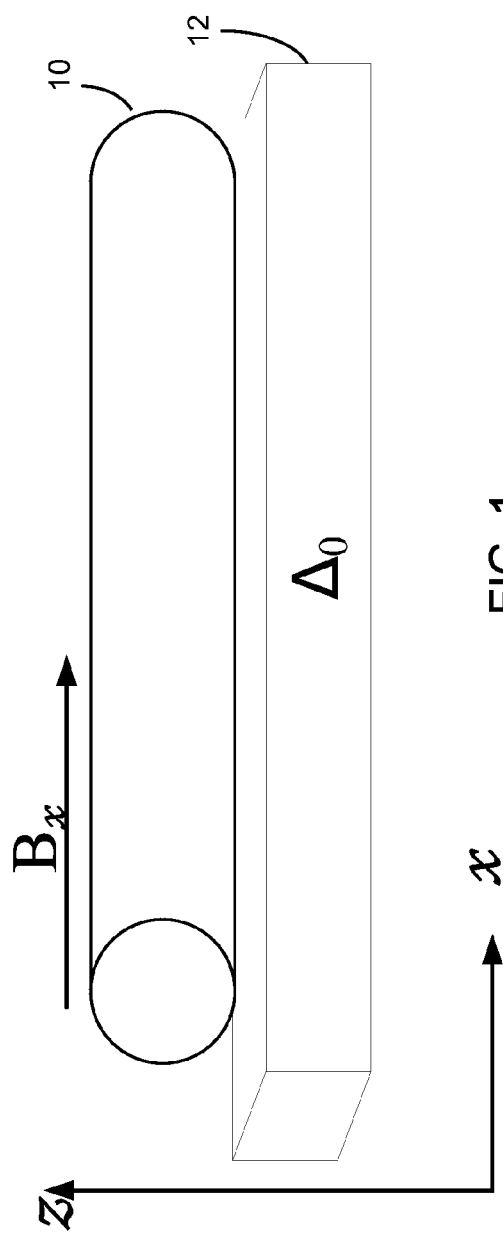
FIG. 1 depicts a semiconductor nanowire coupled by proximity with an s-wave superconductor in the presence of an in-plane magnetic field.

A method for implementing a topological quantum bus may include the use of measurements in an entangled basis, e.g., Bell state measurements. For a topological quantum bus, this can be achieved by a measurement of the joint parity of a topological-conventional qubit pair, given the ability to perform Hadamard gates on any qubit.

Joint parity measurement corresponds to the two orthogonal projectors:

$$\Pi_0 = |00\rangle\langle 00| + |11\rangle\langle 11|, \quad (1)$$

$$\Pi_1 = |01\rangle\langle 01| + |10\rangle\langle 10|, \quad (2)$$

where $|0\rangle$ and $|1\rangle$ and are the logical basis states of the qubits. Topological systems, however, tend to be rather obstructive to such hybridization with external systems. For example, quantum Hall states (the archetypal topological systems) require a large background magnetic field, which "destroys" superconductivity and eliminates the possibility of coupling to Josephson-junction qubits.

Fortunately, recently proposed implementations of Majorana nanowires appear promising for overcoming such obstacles. These wires localize zero energy Majorana fermions at their endpoints and, as such, provide a one-dimensional topologically protected two-level system. It may appear that such a system might provide a topological qubit, but lack quantum information processing. However, a network of Majorana wires may be formed, and manipulated using gate electrodes in a manner that performs braiding exchanges of their endpoints (and, hence, their respective Majorana fermions). This generates the topologically-protected braiding operations of Ising anyons (up to an overall phase) on the topological state space.

It follows from this that Majorana wire networks can be utilized as Ising anyons for topologically-protected quantum information processing. A concrete realization of a topological quantum bus that uses the Aharonov-Casher effect to coherently transfer quantum information between a topological qubit in a Majorana wire system and a conventional semiconductor double-dot qubit will now be described in detail.

The Aharonov-Casher effect involves interference of particles with magnetic moment (vortices) moving around a line charge. It may enable performance of non-local measurements of charge in a region by utilizing the interference of vortices traveling through two different paths around the region. For superconducting systems it is natural to try to use Abrikosov vortices in this context. However, Abrikosov vortices in s-wave superconductors may have rather large mass due to the large number of subgap states localized in their cores. As a result, these vortices may behave classically.

An alternative is to use Josephson vortices (fluxons), which arise due to phase-slip events in Josephson junctions. Their effective mass is determined by the charging and Josephson energies of the junction, and can be much smaller than that of Abrikosov vortices, allowing them to behave quantum-mechanically. Indeed, the Aharonov-Casher effect with Josephson vortices has been experimentally observed, and several proposals have been made to utilize it in the context of topological quantum information processing.

The basic element in the implementation of Majorana wires is a semiconductor nanowire with strong spin-orbit inter-actions, coupled with an s-wave superconductor. FIG. 1 depicts a semiconductor nanowire coupled by proximity with an s-wave superconductor, in the presence of an in-plane magnetic field. The Hamiltonian (with $\hbar=1$) for such a nanowire is:

$$H_0 = \int_{-L/2}^{L/2} dx \psi_\sigma^\dagger(x)\left(-\frac{\partial_x^2}{2m*} - \mu + i\alpha\sigma_y\partial_x + V_x\sigma_x\right)_{\sigma\sigma'} \psi_{\sigma'(x)}, \quad (3)$$

where m*, $\mu$, and $\alpha$ are the effective mass, chemical potential, and strength of spin-orbit Rashba interaction, respectively, and L is the length of the wire, which is taken to be much longer than the effective superconducting coherence length $\xi$ in the semiconductor.

Figure 2:
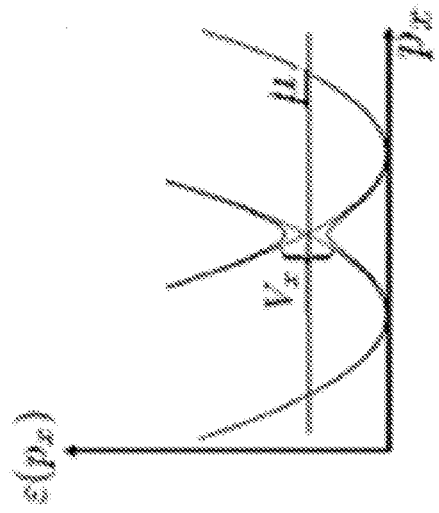
FIG. 2 is a plot of energy dispersion for the semiconductor depicted in FIG. 1, with spin-orbit coupling in the magnetic field.

An in-plane magnetic field $B_x$ leads to spin splitting $V_x = g_{SM}\mu_B B_x/2$, where $g_{SM}$ is the g-factor in the semiconductor, and $\mu_B$ is the Bohr magneton. FIG. 2 is a plot of energy dispersion for the semiconductor, with spin-orbit coupling in the magnetic field $B_x$, which opens a gap in the spectrum. When the chemical potential $\mu$ is in this gap, the nanowire coupled with the s-wave superconductor is driven into topological phase.

In other words, when coupled with an s-wave superconductor, the nanowire can be driven into a non-trivial topological phase with Majorana zero-energy states localized at the ends when the chemical potential is properly adjusted and lies in the gap. In the simplest case of a single-channel nanowire, the topological phase corresponds to $|V_x| > \sqrt{\mu^2+\Delta^2}$, where $\Delta$ is the proximity-induced pairing potential. Multi-channel use is described in R. M. Lutchyn, T. Stanescu, and S. Das Sarma, Phys. Rev. Lett. 106, 127001 (2011), arXiv:1008.0629, incorporated herein by reference.

Figure 3:
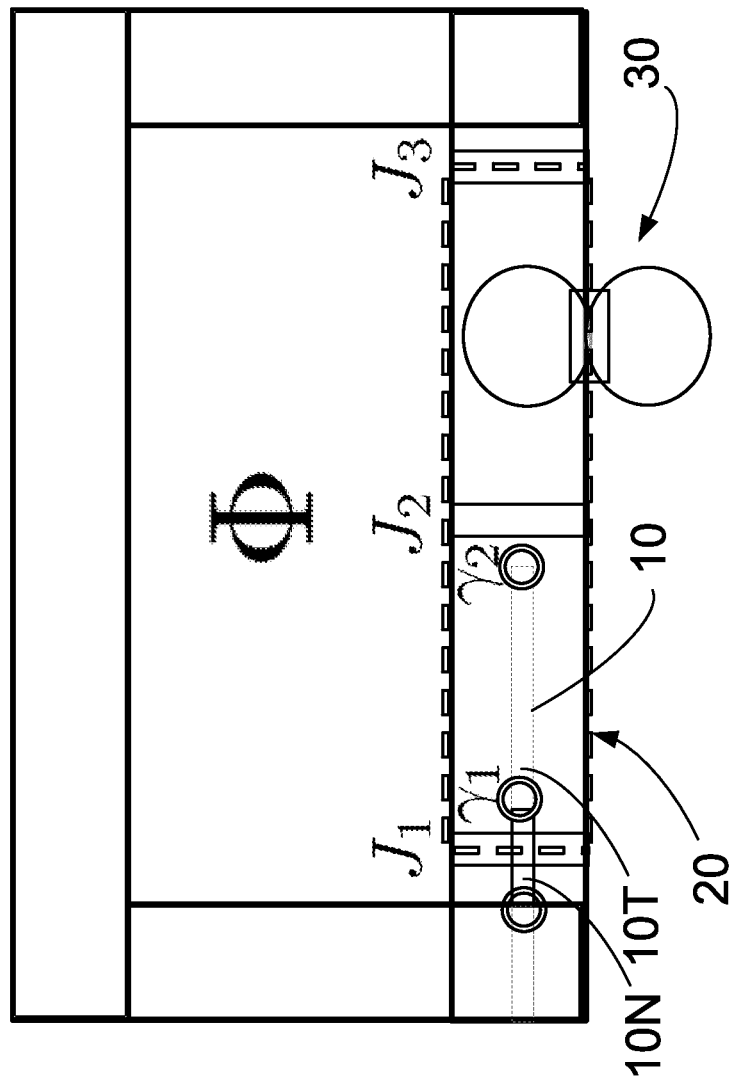
FIG. 3 is a schematic of a device for entangling topological and conventional qubits.
Figure 4:
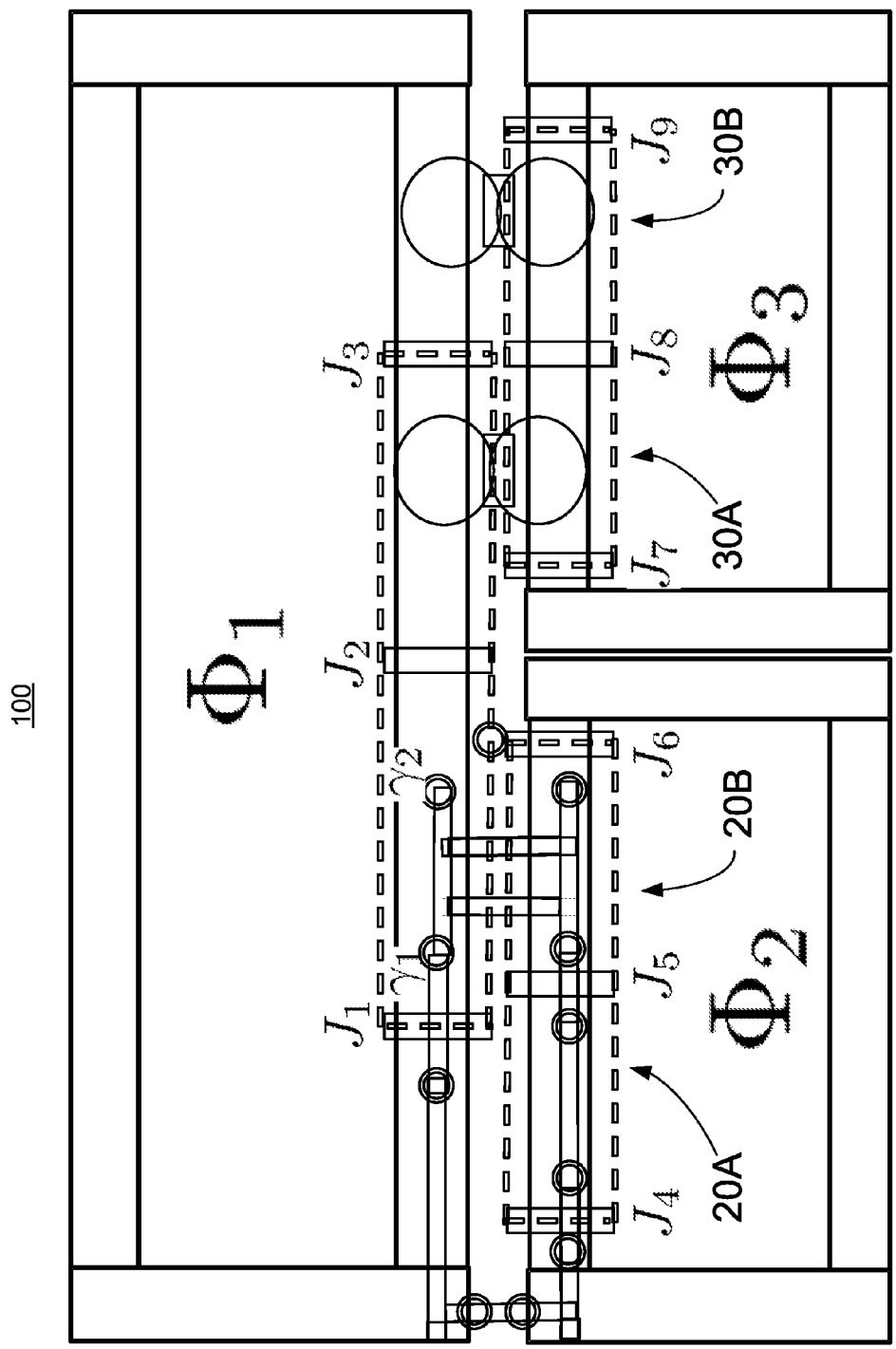
FIG. 4 is a schematic of a device for coherent quantum information transfer between topological and conventional semiconductor qubits using joint parity measurements.

As seen in FIGS. 3 and 4, two Majorana fermions $\gamma_1$ and $\gamma_2$ residing at the ends of a wire 10 constitute a topological qubit 20, since they give rise to a two-level system that is degenerate up to $O(e^{-L/\xi})$ corrections that are exponentially suppressed with the length of the wire 10. Indeed, a non-local Dirac fermion operator can be formally defined as $c=\gamma_1+i\gamma_2$, and then the two logical states of the qubit correspond to the state in which this Dirac fermion is unoccupied $|0\rangle \equiv |n_p=0\rangle$ and occupied $|1\rangle \equiv |n_p=1\rangle$, where $c|n_p=1\rangle = |n_p=0\rangle$, $c|n_p=0\rangle = 0$, and $c^\dagger c|n_p\rangle = n_p|n_p\rangle$. Thus, the topological qubit states are characterized by fermion parity $n_p=0,1$. As previously mentioned, in a network of such wires, these Majorana fermions $\gamma_1$ and $\gamma_2$ behave as Ising non-Abelian anyons when they are translocated, e.g., using gate electrodes.

Topological and conventional qubits can be entangled by measuring the fermion parity on the superconducting island using the Aharonov-Casher effect. FIG. 3 is a schematic of a device for entangling a topological (e.g., Majorana wire) qubit 20 and a conventional (e.g., semiconductor double-dot) qubit 30. A flux qubit $\Phi$ having three Josephson junctions (the strips labeled $J_1$, $J_2$, and $J_3$) supports clockwise or counter-clockwise supercurrent. When $E_{J1}=E_{J3}$, there is interference between quantum phase slips across junctions $J_1$ and $J_3$. These phase slips correspond to Josephson vortex tunneling encircling the superconducting islands as shown by the dashed line. Via the Aharonov-Casher effect, quantum interference of vortices around the islands produces an energy splitting for the flux qubit (at its degeneracy point) that strongly depends on the state of the topological and conventional semiconductor qubits 20, 30. The nanowire 10 may have topological 10T and non-topological 10N segments. The latter can be achieved by driving the wire 10 into the insulating or trivial superconducting phases.

More specifically, consider the superconducting flux qubit $\Phi$ with Josephson junctions designed to have left-right symmetry such that Josephson coupling energies $E_{J1}=E_{J3}\equiv E_J$. The two current-carrying states, clockwise $|\circlearrowright\rangle$ and counter-clockwise $|\circlearrowleft\rangle$, form the basis states of the flux qubit $\Phi$. When the applied external flux piercing the flux qubit $\Phi$ is equal to a half flux quantum, i.e., $\Phi=h/4e$, there is a degeneracy between the two current-carrying states. This degeneracy is lifted by the macroscopic quantum tunneling between the state $|\circlearrowright\rangle$ and $|\circlearrowleft\rangle$ due to the presence of a finite charging energy of the islands, which tends to delocalize the phase. Thus, the new eigenstates of the qubit are $|\pm\rangle = (|\circlearrowright\rangle \pm |\circlearrowleft\rangle)/\sqrt{2}$. For the device shown in FIG. 3, the energy splitting between states $|\pm\rangle$ depends on the quantum interference of the fluxon trajectories. Indeed, the total Josephson energy of the qubit is $$\frac{U_J}{E_J} = -\left[\cos\varphi_1 + \cos\varphi_2 + \frac{E_{J2}}{E_J}\cos\left(2\pi\frac{\Phi}{\Phi_0} - \varphi_1 - \varphi_2\right)\right], \quad (4)$$

where it is assumed that $E_{J1} > E_J$, in contrast with values typically used for flux qubits.

The potential $U_J$ reaches its minima at two inequivalent points $(\phi_1,\phi_2)=(\pm\phi^*+2\pi m, \mp\phi^*\mp 2\pi n)$ for a given n and m which correspond to clockwise and counter-clockwise circulating currents, and $\phi^*=\cos^{-1}(E_J/E_{J2})$. Starting, for example, from the configuration with $(\phi^*,-\phi^*)$, there are two paths to tunnel to a different flux state: $(\phi^*,-\phi^*)\to(\phi^*-2\pi,\phi^*)$, and $(\phi^*,-\phi^*)\to(-\phi^*,\phi^*+2\pi)$, which correspond to a phase slip through junction $J_1$ or $J_3$, respectively. As a result, there is an interference between the two paths that encircle the middle islands in the system shown in FIG. 3. Note that the amplitude for the phase slips across the middle junction is suppressed in this setup since $E_{J2} > E_J$. This interference is sensitive to the total charge enclosed by the paths, i.e., the charge residing on the two islands, and is determined by the Berry phase contribution.

For the device shown in FIG. 3, the splitting energy is given by $\Delta=\Delta_0 \cos(\emptyset_{AC}/2)$, where $\emptyset_{AC}=\pi q/e$ is the Aharonov-Casher phase for total charge on the islands given by $q=en_p+q_{ext}$, where $n_p$ is the fermion occupation of the Majorana wire 10 and $q_{ext}$ is the induced gate charge on the islands. Given that the qubit splitting energy now depends on the fermion occupation number, the state of a topological qubit can be efficiently read out using, for example, the well-known radio-frequency (RF) reflectometry technique, which can be carried out with sub-microsecond resolution times. It is assumed that superconducting islands have the same charging energy yielding the same tunneling amplitude $\Delta_0$. Assuming $E_J/E_c \approx 10$ and $E_{J2}/E_{J1} \approx 1.25$, WKB approximation gives $\Delta_0 \approx 0.02 h v_a$, where $v_a$ is the attempt frequency, which is estimated to be $v_a \sim 0.1 - 1$ GHz.

A situation where $q_{ext}$ has a quantum component corresponding to coherent electron tunneling inside the area enclosed by the vortex circulation can be realized, for example, by coupling the flux qubit $\Phi$ to a semiconductor double quantum dot (DQD) qubit 30, as shown in FIG. 3. Galvanic isolation may exist between the superconductor and semiconductor so that there is no charge transfer between them. DQD qubits may be realized using indium arsenide (InAs) nanowires, which may thus serve as a dual-purpose component (i.e., also being used for the Majorana nanowires).

If there is a single electron in the DQD, the logical qubit basis states can be defined to be $|0\rangle \equiv |0\rangle_U \otimes |1\rangle_L$, where the electron occupies the lower quantum dot, and $|1\rangle \equiv |01\rangle_U \otimes |0\rangle_L$, where the upper quantum dot is occupied. This situation corresponds to a semiconductor charge qubit. If there are two electrons in the DQD, then the logical qubit basis states can be defined to be $|0\rangle \equiv |0\rangle_U \otimes |2\rangle_L$ and $|1\rangle \equiv |1\rangle_U \otimes |1\rangle_L$, where the electron spins are in the singlet and triplet states, respectively. This situation corresponds to the semiconductor spin qubit.

Both these qubits share a common feature that can be exploited: the qubit basis states correspond to the electron parity on the upper dot enclosed by the vortex circulation. If the evolution of the semi-conductor qubit is much slower than the measurement time and fluxon tunneling rate, then the flux qubit $\Phi$ can be used to entangle topological and conventional qubits 20, 30 via the Aharonov-Casher effect. Indeed, the flux qubit splitting energy $\Delta$ is the same for combined topological-DQD qubit states with equal joint-parity, i.e., the combined states $|00\rangle$ and $|11\rangle$ have the same splitting, and $|01\rangle$ and $|10\rangle$ have the same splitting. Thus, measurement of the flux qubit splitting energy $\Delta$ is equivalent to a joint parity measurement corresponding to the projectors $\Pi_0$ and $\Pi_1$ from Eqs. (1) and (2) acting on the topological-DQD qubit pair.

If the topological and conventional qubits 20, 30 are initially prepared in the superposition states $|\psi_T\rangle = \alpha_T|0\rangle + \beta_T|1\rangle$ and $|\psi_C\rangle = \alpha_C|0\rangle + \beta_C|1\rangle$, respectively, then application of the even or odd parity projectors gives the (unnormalized) states $$\Pi_0(|\psi_T\rangle \otimes |\psi_C\rangle) = \alpha_T\alpha_C|00\rangle + \beta_T\beta_C|11\rangle \tag{5}$$

$$\Pi_1(|\psi T\rangle \otimes |\psi C\rangle) = \alpha_T\beta_C|01\rangle + \beta_T\alpha_C|10\rangle, \tag{6}$$

It should be understood that the flux qubit $\Phi$ acts as an interferometer that enables this measurement.

Qubits can be entangled and coherent quantum information transfer performed using parity measurements with the help of two flux qubits. The maximally entangled Bell states (which can be used as entanglement resources) may be denoted as $$|\Phi_\mu\rangle \equiv (1 \otimes \sigma_\mu)(|01\rangle - |10\rangle)/\sqrt{2}, \tag{7}$$

for $\mu=0,1,2,3(\sigma_\mu=1)$. The ability to perform measurements in the Bell basis allows for the teleportation of quantum states, and hence, for the transfer quantum information. It should be understood from Eqs. (5) and (6) that joint parity measurements can produce entangled states, such as Bell states. More generally, however, it should be understood that $$\Pi_0 = |\Phi_1\rangle\langle\Phi_1| + |\Phi_2\rangle\langle\Phi_2| \tag{8}$$

$$\Pi_1 = |\Phi_0\rangle\langle\Phi_0| + |\Phi_3\rangle\langle\Phi_3| \tag{9}$$

$$\Pi'_0 = (H \otimes H)\Pi_0(H \otimes H) = |\Phi_2\rangle\langle\Phi_2| + |\Phi_3\rangle\langle\Phi_3| \tag{10}$$

$$\Pi'_1 = (H \otimes H)\Pi_1(H \otimes H) = |\Phi_0\rangle\langle\Phi_0| + |\Phi_1\rangle\langle\Phi_1| \tag{11}$$

where the (single-qubit) Hadamard gate is given by $$H = \frac{1}{\sqrt{2}}\begin{bmatrix} 1 & 1 \\ 1 & -1 \end{bmatrix}. \tag{12}$$

Hence, joint parity measurements combined with Hadamard gates fully resolves the Bell basis.

Hadamard gates can be generated (with topological protection) by braiding Ising anyons and through standard methods for conventional qubits. As described above, the device depicted in FIG. 3 can be used to implement a joint parity measurement of a topological-conventional qubit pair 20, 30. It can also be used to implement joint parity measurements of topological-topological and conventional-conventional qubit pairs.

Specifically, consider the device 100 shown in FIG. 4 where there are three flux qubits $\Phi_1$, $\Phi_2$, and $\Phi_3$. One of these, $\Phi_3$, is coupled to two semi-conductor DQD qubits 30A, 30B. Again, it is assumed that there is right-left symmetry ($E_{J7}=E_{J9}$) so that fluxon tunneling in the superconducting qubit that allows for measuring the combined charge parity for the conventional-conventional qubit pair, as explained above. The other flux qubit $\Phi_2$, with ($E_{J4}=E_{J6}$) allows for joint parity measurements on topological-topological qubit pairs. The combined device 100 allows quantum information to be transferred between topological and conventional qubits 20, 30. Finally, by tuning the external fluxes $\Phi$ away from the degeneracy point, flux and conventional or topological qubits can be decoupled.

It should be understood that the joint parity measurement device 100 depicted in FIG. 4 not only allows for coherent entanglement and transfer of information between topological and conventional systems, but also provides a new method of entangling conventional qubits, e.g., semiconductor charge or spin qubits, with each other, and hence could also be useful for purely conventional systems.

It should be understood from the foregoing description that a topological quantum bus may process is accordance with the method 200 of FIG. 5. That is, a method 200 for coherent coupling of topological and conventional qubits may include, at step 202, providing a topological qubit and a conventional qubit that are coupled to one another via a plurality of Josephson junctions.

At 204, a joint parity measurement may be performed. The joint parity measurement may enable quantum information to be coherently transferred between the topological and conventional qubits. The joint parity of the topological and conventional qubits may be measured via the Aharonov-Casher effect. The joint parity measurement may be performed in the Bell basis. Hadamard gates may be applied to the topological and conventional quabits. The Hadamard gates may be generated by braiding Ising anyons.

At 206, quantum information may be coherently transferred between the topological and conventional qubits.

The invention claimed is:

1. A method of performing a quantum operation, the method comprising: coupling, at a mixed-media quantum bus, a topological qubit and a nontopological qubit, wherein the mixed-media quantum bus includes topological medium and nontopological medium.

2. The method of claim 1, wherein coupling the topological qubit and the nontopological qubit comprises:
performing a joint parity measurement that enables quantum information to be transferred between the topological and nontopological qubits.

3. The method of claim 2, wherein the joint parity measurement of the topological and nontopological qubits is measured via an Aharonov-Casher effect.

4. The method of claim 1, wherein coupling the topological qubit and the nontopoloqical qubit comprises:
teleporting a quantum state between the topological and nontopoloqical qubits.

5. The method of claim 2, wherein the topological qubit is a first topological qubit, and wherein the first topological qubit and the nontopological qubit comprise a topological-nontopological qubit pair, the method further comprising:
entangling a second topological qubit with at least a portion of the topological-nontopological qubit pair, wherein quantum state information is transferred between the second topological qubit and the topological-nontopological qubit pair.

6. The method of claim 5, wherein entangling the second topological qubit with the portion of the topological-nontopological qubit pair comprises:
performing a joint parity measurement on the first and the second topological qubits, wherein quantum state information is transferred between the second topological qubit and the nontopological qubit.

7. The method of claim 6, wherein the first topological qubit is comprised of a first quasiparticle and a second quasiparticle, wherein the first quasiparticle is coupled to the nontopological qubit via a first flux qubit, and wherein entangling the first and the second topological qubits comprises:
utilizing a second flux qubit to measure an Aharonov-Casher effect on a total charge comprised of the second topological qubit and at least the second quasiparticle of the first topological qubit.

8. The method of claim 7, further comprising:
decoupling the second flux qubit from the second topological qubit and at least the second quasiparticle of the first topological qubit.

9. The method of claim 8, wherein decoupling the second flux qubit from the second topological qubit and at least the second quasiparticle of the first topological qubit comprises:
tuning a flux away from a degeneracy point.

10. The method of claim 2, wherein the nontopological qubit is a first nontopological qubit, and wherein the topological qubit and the first nontopological qubit comprise a topological-nontopological qubit pair, the method further comprising:
entangling a second nontopological qubit with at least a portion of the topological-nontopological qubit pair, wherein quantum state information is transferred between the second nontopological qubit and the topological-nontopological qubit pair.

11. The method of claim 10, wherein entangling the second nontopological qubit with the portion of the topological-nontopological qubit pair comprises:
performing a joint parity measurement on the second nontopological qubit and the first nontopological qubit of the topological-nontopological qubit pair.

12. The method of claim 11, wherein the first nontopological qubit is a charge double-dot qubit, wherein a first quasiparticle of the topological qubit is coupled to a first dot of the charge double-dot qubit nontopological qubit via a first flux qubit, and wherein performing the joint parity measurement on the second nontopological qubit and the first nontopological qubit of the topological-nontopological qubit pair comprises:
utilizing a second flux qubit to measure an Aharonov-Casher effect on a total charge parity comprised of the second nontopological qubit and a second dot of the charge double-dot qubit.

13. The method of claim 12, further comprising:
decoupling the second flux qubit from the second nontopological qubit and the second dot of the charge double-dot qubit.

14. The method of claim 13, wherein decoupling the second flux qubit from the second nontopological qubit and the second dot of the charge double-dot qubit comprises:
tuning a flux away from a degeneracy point.

15. A method for implementing a quantum bus, comprising:
performing a first joint parity measurement on a first portion of a topological-nontopological qubit pair, wherein the topological-nontopological qubit pair is comprised of the first portion, a second portion and a third portion; and
performing a second joint parity measurement on a topological qubit and the second portion of the topological-nontopological qubit pair; and
wherein upon completion of performing the first and the second joint parity measurements, the topological qubit and the topological-nontopological qubit pair are entangled.

16. The method of claim 15, wherein performing the second joint parity measurement on the topological qubit and the second portion of the topological-nontopological qubit pair comprises:
teleporting quantum information between the topological qubit and the topological-nontopological qubit pair.

17. The method of claim 15, wherein performing the first joint parity measurement on the first portion of the topological-nontopological qubit pair comprises measuring a first Aharonov-Casher effect for a first total charge comprising the first portion of the topological-nontopological qubit pair, and wherein performing the second joint parity measurement on the topological qubit and the second portion of the topological-nontopological qubit pair comprises measuring a second Aharonov-Casher effect for a second total charge comprising the topological qubit and the second portion of the topological-nontopological qubit pair, and wherein upon completion of the measurements of the first and the second Aharonov-Casher effects, quantum state information is teleported from the topological qubit to the third portion of the topological-nontopological qubit.

18. A method for implementing a quantum bus, comprising:
performing a first joint parity measurement on a first portion of a topological-nontopological qubit pair, wherein the topological-nontopological qubit pair is comprised of the first portion, a second portion and a third portion; and performing a second joint parity measurement on a nontopological qubit and the second portion of the topological-nontopological qubit pair; and wherein upon completion of performing the first and the second joint parity measurements, the nontopological qubit and the topological-nontopological qubit pair are entangled.

19. The method of claim 18, wherein performing the second joint parity measurement on the nontopological qubit and the second portion of the topological-nontopological qubit pair comprises:

teleporting quantum state information between the nontopological qubit and the topological-nontopological qubit pair.

20. The method of claim 18, wherein performing the first joint parity measurement on the first portion of the topological-nontopological qubit pair comprises measuring a first Aharonov-Casher effect for a first total charge comprising the first portion of the topological-nontopological qubit pair, and wherein performing the second joint parity measurement on the nontopological qubit and the second portion of the topological-nontopological qubit pair comprises measuring a second Aharonov-Casher effect for a second total charge comprising the nontopological qubit and the second portion of the topological-nontopological qubit pair, and wherein upon completion of the measurements of the first and the second Aharonov-Casher effects, quantum state information is teleported from the nontopological qubit to the third portion of the topological-nontopological qubit.

* * * * *